(12) United States Patent
Varkony et al.

(10) Patent No.: US 9,479,171 B2
(45) Date of Patent: Oct. 25, 2016

(54) METHODS, CIRCUITS, DEVICES AND SYSTEMS FOR INTEGRATED CIRCUIT VOLTAGE LEVEL SHIFTING

(71) Applicant: Spansion LLC, Sunnyvale, CA (US)

(72) Inventors: Roni Varkony, Netanya (IL); Yoram Betser, Mazkeret-Batya (IL)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 84 days.

(21) Appl. No.: 14/284,812

(22) Filed: May 22, 2014

(65) Prior Publication Data

US 2015/0341034 A1 Nov. 26, 2015

(51) Int. Cl.
*H03K 19/0185* (2006.01)
*H03K 3/356* (2006.01)

(52) U.S. Cl.
CPC .. *H03K 19/018507* (2013.01); *H03K 3/35613* (2013.01)

(58) Field of Classification Search
CPC ............. H03K 19/018507; H03K 19/018514; H03K 19/018521; H03K 19/018528
USPC .......................... 327/333; 326/63, 68, 80, 81
See application file for complete search history.

(56) References Cited

U.S. PATENT DOCUMENTS

| | | | |
|---|---|---|---|
| 4,318,015 A * | 3/1982 | Schade, Jr. | ...................... 326/68 |
| 7,710,182 B2 * | 5/2010 | Yu et al. | ........................ 327/333 |
| 7,768,308 B2 * | 8/2010 | Maede et al. | ................... 326/68 |
| 8,564,357 B2 * | 10/2013 | Kimoto | ......................... 327/333 |
| 9,124,259 B2 * | 9/2015 | Kimoto | |
| 2010/0201427 A1 * | 8/2010 | van den Berg et al. | ....... 327/333 |
| 2011/0102383 A1 * | 5/2011 | Cho | .............................. 345/204 |
| 2012/0268187 A1 | 10/2012 | Kimoto | |
| 2013/0113541 A1 | 5/2013 | Crespi et al. | |

* cited by examiner

*Primary Examiner* — William Hernandez
(74) *Attorney, Agent, or Firm* — Vladimir Sherman; Professional Patent Solutions (57) ABSTRACT

Disclosed is an integrated circuit voltage level shifter including: a first set of pull-up transistors to selectively pull an output voltage towards a high voltage source level based on an input; a second set of pull-down transistors adapted to selectively pull the output voltage towards a lower voltage source level based on the input and a third set of transistors to limit current flow through the second set of pull-down transistors and to mitigate snapback of the second set of pull-down transistors using a bias gate voltage.

18 Claims, 8 Drawing Sheets

METHODS, CIRCUITS, DEVICES AND SYSTEMS FOR INTEGRATED CIRCUIT VOLTAGE LEVEL SHIFTING

FIELD OF THE INVENTION

The present invention relates generally to the field of voltage level shifting in an integrated circuit. More specifically, the present invention relates to methods, circuits, devices, systems for voltage level shifting in an integrated circuit including a biasing stage.

BACKGROUND

Integrated circuits (IC) may be used in a wide range of designs and products. In some designs an IC's input supply voltage may be either fixed or not equal to a required voltage for operation of some of the internal/embedded circuits of the IC. Level shifting circuits and additional dedicated internal/embedded analog circuits may be utilized to provide different voltage levels based on the IC's input supply voltage and control inputs. Furthermore, in some modes of operation different voltage levels may be required for the same circuit.

An example of an IC utilizing voltage shifting is a Non Volatile Memory (NVM) array. An NVM array may be composed of NVM cells, ancillary circuitry, controller and additional circuits which may also require multiple or changing supply levels. For example, a NVM array may require different voltages in different operation modes such as Program, Read and Erase and more. The ancillary circuitry which may include for example: array controls, address decoding circuits, sense amplifiers (SA) configured to determine a value/level of a targeted NVM cell may also be required to operate under changing/alternating supply levels.

Some memory array types may include NVM arrays, floating gate arrays, array of eCT cells, array of MirrorBit cells, charge trapping cells and more. Some transistor types which may be used in ancillary circuitry are Pmos, Nmos, low voltage (LV) Nmos, LV Pmos, high voltage (HV) Nmos and HV Pmos, Zmos, BJT and more. HV transistors/cells may be differentiated from LV transistors/cells by being designed/configured to enable operation in a higher range of voltages across their channel compared to LV cells (for example, between a drain node and a source node of the transistor) and/or across the gate (for example: between their gate and bulk or ground node) and may include a think oxide region compared to LV devices.

Figure 1A:
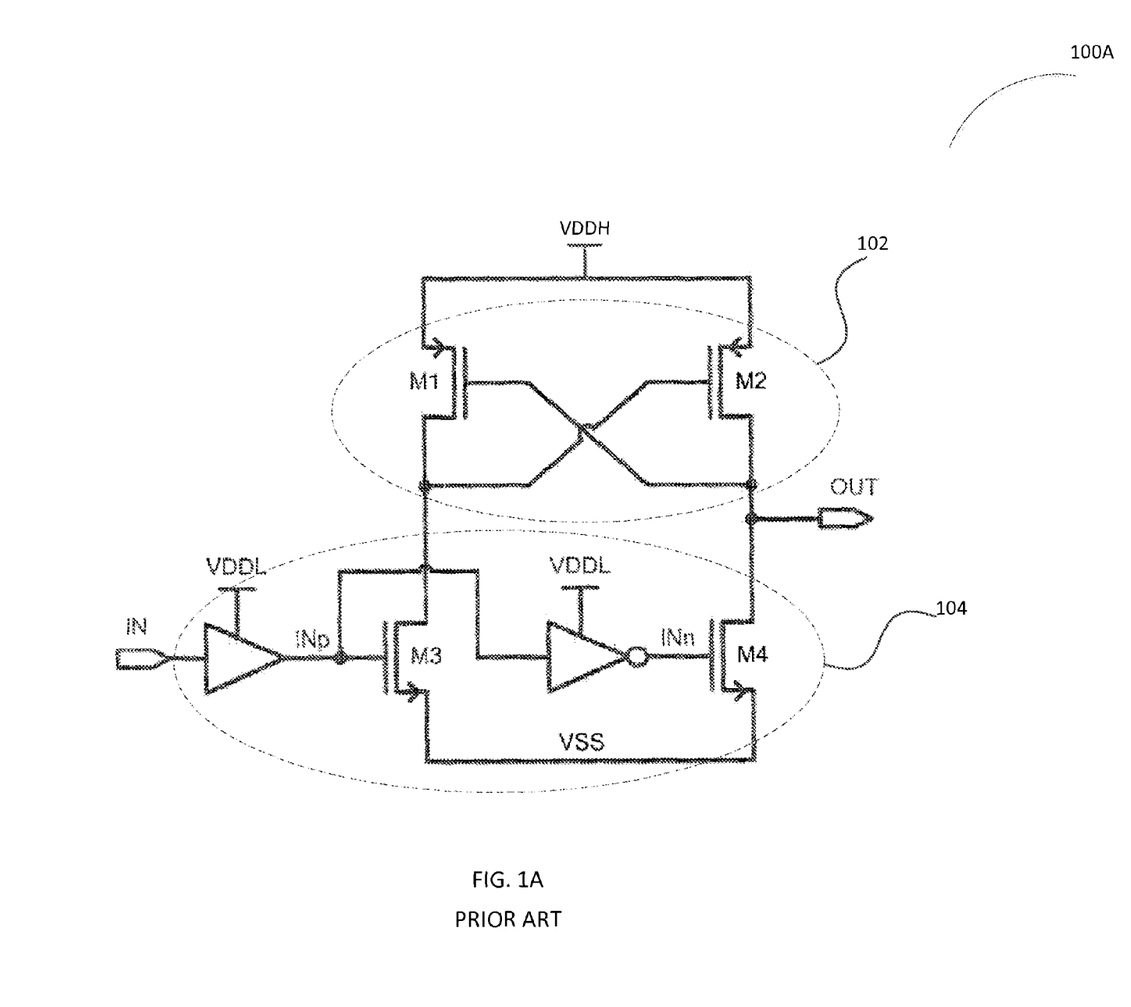
FIGS. 1A and 1B depict example prior art level shifters.

Turning now to Prior Art FIG. 1A, depicted is an example level shifter 100A. Example level shifter 100A may operate by using a cross coupled stage 102 including transistors M1 and M2, and an input stage 104 including transistors M3 and M4 and some logical gates. Transistors M1 and M2 are connected to connected to the output supply voltage (OUT) and to the high voltage source VDDH The cross coupled connection between transistors M1, M2, M3 and M4 may act as a feedback circuit, that generates "gain", when one of the cross coupled transistors (M1 or M2) senses that one of the branches (for example the line between M1 and M3) goes down or up it may cause the other branch (for example between M2 and M4) to change accordingly and may cause the level shifter 100A to switch. The input stage may be connected to the level shifted supply VDDL. VSS is substantially a ground voltage. Depending on design considerations or constraints such as: (a) the ratio between the input voltage (IN) and the output supply voltage (OUT); (b) Breakdown voltages of the transistors and more the M1 and M2 transistors and the M3 and M4 transistors may be designed so that level shifter 100A is caused to flip in response to a change in the input supply (IN). In some embodiments, when the overdrive of the input is much lower than the overdrive of the cross coupled stage 102 (for example a large ratio between IN and OUT) the input transistors (M3 and M4) may be selected to be large (transistors that are not large enough may cause the level shifter not to flip states).

In some embodiments, the NMOS transistors may be prone/suffer from snapback and/or breakdown in which case protection may be required for the NMOS transistors. A typical ratio of the size between one of the cross coupled Pmos transistors to the size of one of the input stage transistors may be 1:5 to 1:10 depending on the technology and on the supply voltage levels. The size of a transistor refers to the width (w) of a transistor divided by the length (l).

Figure 1B:
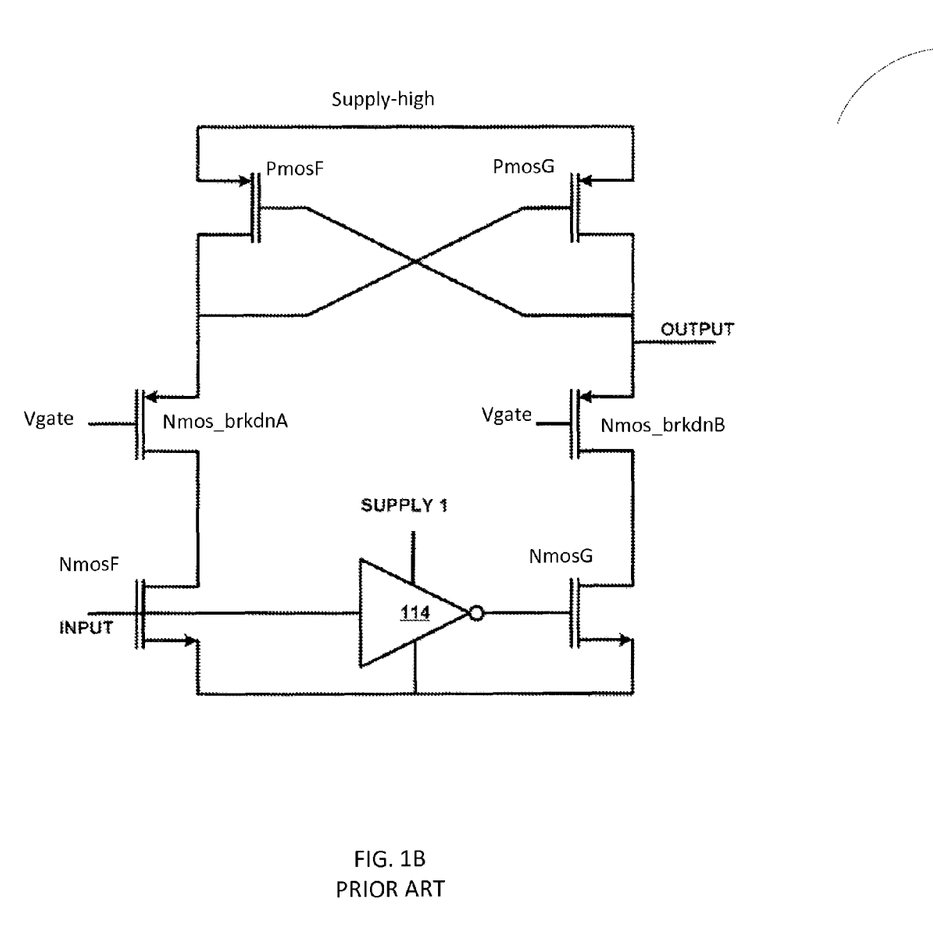

Turning to FIG. 1B, depicted is a prior art level shifter 100B including cross coupled Pmos transistors PmosF and PmosG and an input stage including transistors Nmos and Nmos. In this configuration, protection transistors Nmos_brkdnA and Nmos brkdnB with a dynamically controlled gate voltage input (Vgate) may protect input NMOS transistors NmosF and NmosG. Adding this type of protecting may cause the NMOS path to be further degraded/weakened subsequently causing the required input transistors to be even larger than in the architecture of FIG. 1A (when compared to the Pmos transistors). Furthermore, the ratio of the size between one of the cross coupled Pmos transistors to the size of one of the input stage transistors to grow to example ratio 1:15 or more. The size of a transistor refers to the width (w) of a transistor divided by the length (l). Moreover, the current consumption during switching of level shifter 100B may become high due to the weak NMOS path. In some embodiments, when large transistors are used the parasitic capacitance may increase resulting in degraded performance and even higher current consumption. For IC's, where hundreds of level shifter such as level shifter 100B may be required, the area penalty may be considered very significant and the peak current, if multiple level shifter 100Bs are switched together may be very high.

Breakdown of transistors may occur, for example, when a voltage across a transistor (from drain to source or from gate to drain or otherwise) is too high and causes the transistor to be physically destructed and/or be corrupted or inoperable. Referral to a high voltage is in absolute terms (i.e. a negative or positive voltage). Similarly, snapback may occur when the high voltage across the channel is accompanied by a high current and may also lead to breakdown or to induce latchup. Breakdown and Snapback are well known terms and should not be limited to the above description.

SUMMARY OF THE INVENTION

The present invention is methods, circuits, devices and systems for integrated circuit voltage level shifting. According to some embodiments of the present invention, an integrated circuit voltage level shifter including: a first set of pull-up transistors which may electively pull an output voltage towards a high voltage source level based on an input, a second set of pull-down transistors which may selectively pull the output voltage towards a lower voltage source level based on the input and a third set of transistors which may limit current flow through the second set of pull-down transistors and may further mitigate snapback of the second set of pull-down transistors for example, by using a bias gate voltage which may be dependent on the lower voltage source level.

According to some embodiments, an integrated circuit may further including a bias gate voltage source which may provide a bias gate voltage so that a predetermined current flows through the third set of transistors. The bias gate voltage source may be at least one branch of a current mirror.

According to some embodiments, current flowing through the first set of pull-up transistors may be limited by the third set of transistors. The first set of pull-up transistors may be pmos transistors, the second set of pull down transistors may be nmos transistors and the third set of transistors may be nmos transistors.

According to some embodiments, the input may be substantially limited between the high voltage source and a medium voltage and the output voltage may be substantially limited between the high voltage source and the lower voltage source. According to some embodiments, the ratio between the size of at least one transistor included in the first set of transistors and the size of at least one transistor included in the second set of transistors may be no greater than 5 or no greater than 4.

According to some embodiments, the high voltage source may be selected from the range of: 0V to 10V, the medium voltage source is 0V and the lower voltage source may be selected from the range of minus 10V and 0V. The high voltage source may be higher or equal to the medium voltage source and the medium voltage source may be higher or equal to the low voltage source excluding when all of the voltage sources are 0V.

According to some embodiments, an integrated circuit may include an NVM memory array, ancillary circuitry including a controller which may control the NVM memory array and at least one voltage level shifter which may selectively supply the NVM memory array and the ancillary circuitry with either a high voltage source or a low voltage source, the at least one level shifter may include a first stage which may selectively pull an output voltage towards the high voltage source level based on an input, a second stage which may selectively pull the output voltage towards the low voltage source level based on the input and a third stage which may limit current flow through the second stage and to mitigate snapback across the second stage.

According to some embodiments, the integrated circuit may further include a biasing voltage source which may cause a predetermined current through the first stage. The biasing voltage may include at least one branch of a current mirror. The current flowing through the second stage may be limited by the third stage.

According to some embodiments, the first stage may include a first set of pull-up transistors the second stage may include a second set of pull down transistors and the third stage may include a third set of transistors.

According to some embodiments, the third set of transistors may be a branch of the current mirror.

According to some embodiments, the input may be substantially limited between the high voltage source and a medium voltage and the third stage may receive a bias gate voltage and the bias gate voltage may be dependent on the low voltage source level.

According to some embodiments, a method of level shifting associated with an integrated circuit may include: selectively pulling an output voltage up toward a high voltage source using a first set of transistors or using a second set of transistors, pulling down toward a lower voltage source based on an input, providing a bias gate voltage to cause a fixed current through at least a segment of the integrated circuit and using the fixed current source for both (a) limiting current flow through the second set of transistors and (b) mitigating snapback on the second set of transistors.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

In some examples and/or embodiments a voltage level is discussed, it is understood that while voltage levels may be described as 'equal', due to operational and physical parameters the voltages may be substantially equal differing due to parasitic capacitances, loads and the like or otherwise.

The present invention includes methods, circuits, devices and systems for voltage level shifting in an integrated circuit. According to some embodiments, a level shifter output may be configured to transition between a first supply level (Supply 1) and a third supply level (Supply3). The level shifter may be operable for a wide range of supply voltages. One example may include: Supply 1 at around −8V; Supply 2 at around ground (or 0V) and Supply3 at around 2V. Another example may include Supply1 at around ground or 0V; Supply2 at around ground (or 0V) and Supply3 at around 10V. The level shifter may include at least three stages: a first stage which may be an input stage, a second stage which may be an intermediate stage and a third stage which may be a biasing stage. In a transitory/switching state—for example when the input switches its value: the first input stage may be configured to pull-up the output toward the third supply level depending on the input; the second intermediate stage may be configured to pull down the output branch toward the first supply level and the third stage may be a biasing stage configured to limit current flow through the second stage and to mitigate snapback of transistors within the second stage for example utilizing a bias gate voltage which may be dependent on the first supply level or resistors to limit current or a direct current source or otherwise. Additional configurations to limit the current in the level shifter at least during the transitory state such are understood.

According to some embodiments, $V_{out}$ may be connected to one or more circuits or blocks within an IC to supply an input or a supply voltage to these circuits/blocks According to some embodiments, the biasing stage may include at least a branch of a current mirror which may be operably connected to the second stage so that the current flowing through transistors of the second stage is known/predetermined and accordingly, controlled. Control of flow through transistors of the second stage may assist/contribute to control of contention between the first stage and the second stage and enable using smaller transistors. This may be substantial in saving costly area in the integrated circuit and may further mitigate snapback (and/or breakdown) across the second stage transistors.

Figure 2:
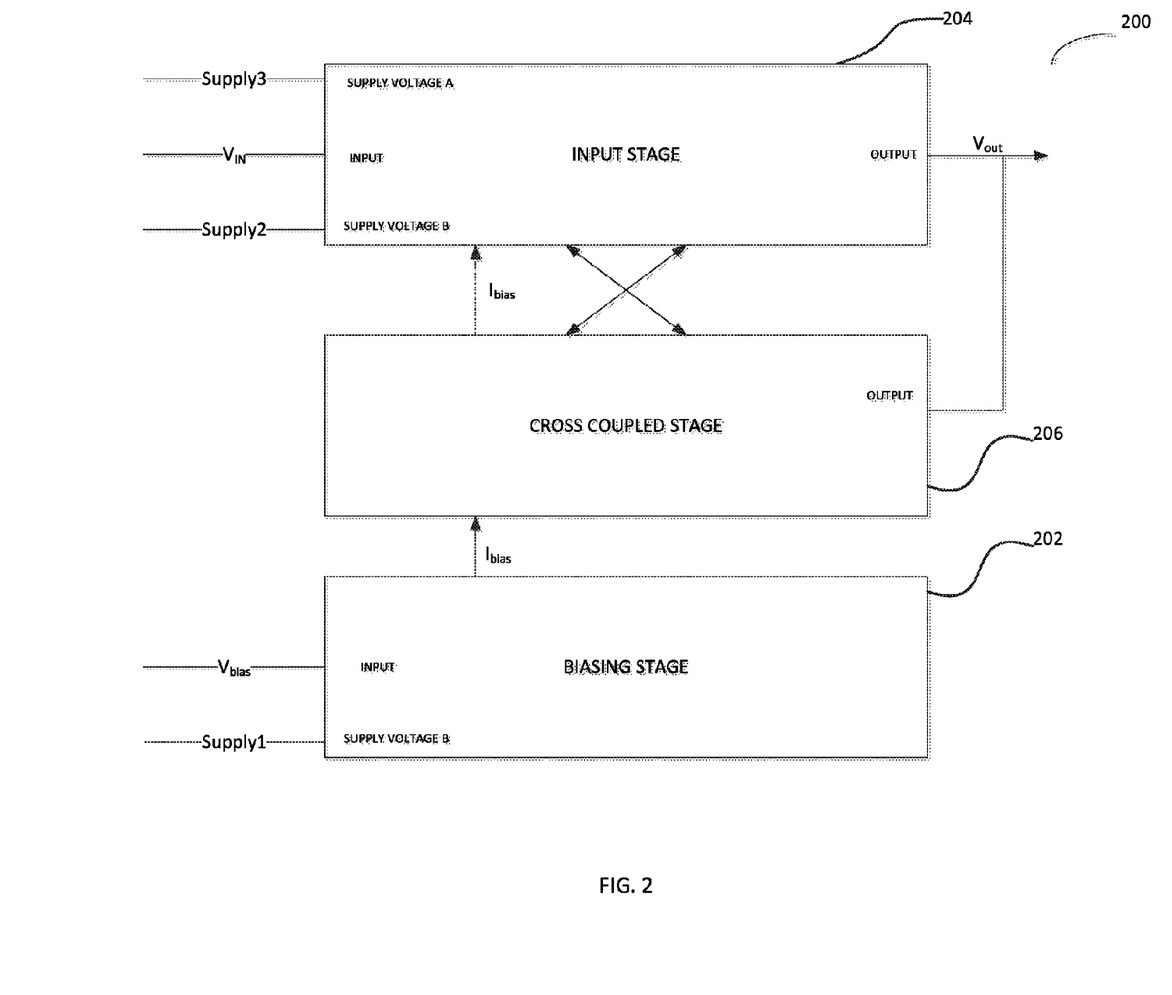
FIG. 2 depicts a block-level level shifter including a biasing stage in accordance with some embodiments of the present invention.

It is noted that some operational discussion of some embodiments of level shifters as discussed in this document relate to a transitory state of operation of the example level shifters responsive to a switch/change in the input voltage. It is understood that the level shifters may also has a steady state, for example while the input and supply voltages are substantially fixed/constant/steady and that some of the description relating to the transitory state may not be relevant to a steady state. In a steady state the level shifter may substantially supply a stable, constant, fixed and/or steady voltage supply. Furthermore, while the input voltage is steady the level shifter may track/follow any changes in supplies and may do so without changing it's logical value/switching, Turning to FIG. 2 depicted is a block-level level shifter (LS) 200. LS 200 may receive some or all of the following voltage supply levels: Supply3, Supply2 and Supply1. The LS 200 may be operable at the following example supply voltage levels: Supply1 between ground (0V) and 10V, Supply2 and ground (0V) and Supply3 between 0 and −10V. It is further understood that Supply3 is larger or equal to Supply2 and that Supply2 is larger or equal to Supply1, excluding the example where all the supplies are equal to each other. Two examples may include: (a) Supply1 at around −8V; Supply2 at around ground (or 0V) and Supply3 at around 2V and (b) Supply1 at around ground or 0V; Supply2 at around ground (or 0V) and Supply3 at around 10V it is understood that many more examples exist/can be used.

According to some embodiments, LS 200 may further receive a level shifter input such as $V_{in}$ which may be configured to designate/determine the output voltage $V_{out}$. $V_{in}$ may have a logical value between '1' and '0' which may be substantially equal to Supply3 and Supply2 accordingly. $V_{out}$ may selectively output a voltage substantially equal to Supply3 or Supply1 so that if $V_{in}$ is equal to Supply3, $V_{out}$ outputs a voltage substantially equal to Supply3 and if $V_{in}$ is equal to Supply2 $V_{out}$ outputs a voltage substantially equal Supply1 or vice-versa (if $V_{in}$ is equal to Supply2 $V_{out}$ outputs a voltage substantially equal to Supply3).

According to some embodiments, LS 200 may also receive a Bias input which may be configured to limit current through at least one branch/segment of biasing stage 202. In FIG. 2 the bias input is depicted as $V_{bias}$, but it is understood that in additional embodiments, the biasing input may also be a current input and is not limited to a voltage input. Furthermore, for some embodiments, no additional/dedicated input may be needed to achieve the limited current (for example when a resistor is used instead of a current mirror or when a fixed supply such as Supply3 is used instead of $V_{bias}$).

According to some embodiments the Bias input may be $V_{bias}$ which in some configurations may be equal to Supply1+Vt and/or may be a dynamic voltage source in that it substantially follows/moves with Supply1. Vt may be substantially equal to a threshold voltage level of a predefined transistor or may try to emulate the typical threshold value of an average transistor of a predefined/preselected type/configuration. Vbias may be generated by a current mirror and connected within biasing stage 202 to segments/branches configured to be branches of the current mirror so that current within the segments/branches is limited according to/as a function of the current mirror limited current.

According to some embodiments, level shifter 200 may output an output voltage such as $V_{out}$. In a transitory stage $V_{out}$ may transition between a first supply level (Supply1) and a third supply level (Supply3) (or vice versa) and in a steady state may output one of the two voltages (Supply1 or Supply3). $V_{out}$ may depend/be determined by $V_{in}$.

According to some embodiments, $V_{bias}$ may be a fixed voltage such as Supply3.

According to some embodiments, an additional inverter may be added to the output so that a barred output is achieved $V_{out\_b}$ (not depicted). $V_{out\_b}$ may also transition between a first supply level (Supply1) and a third supply level (Supply3) (or vice versa) and in a steady state may output one of the two voltages (Supply1 or Supply3). $V_{out\_b}$ may depends/be determined by $V_{in}$ and is typically opposite to $V_{out}$ (when $V_{out}$ is equal to Supply1 $V_{out\_b}$ may be equal to Supply3). $V_{out\_b}$ may also be produced/output from the cross coupled stage 206.

According to some embodiments, level shifter 200 may include at least three stages. A first stage (stage 1) may be an input stage such as input stage 204. A second stage (stage 2) may be a cross coupled stage and/or an output stage such as cross-coupled stage 206 and a third stage (stage 3) which may be a biasing stage such as biasing stage 202.

According to some embodiments, during a transitory state input stage 204 may selectively pull up $V_{out}$ toward a high voltage source, such as Supply3. Input stage is configured to do so based on $V_{in}$ (i.e. if $V_{in}$ transitions to a logical '1' the output may be pulled up toward Supply3. Of course, input stage 204 can also be configured to pull up $V_{out}$ toward Supply3 in response to $V_{in}$ transitioning to a logical '0'; this is determined by the logical design of the level shifter).

According to some embodiments, during a transitory state, cross-coupled stage 206 may selectively pull down an output voltage toward a lower voltage source such as Supply1, depending on V. The crossed bi-directional lines connecting input stage 204 and cross coupled stage 206 are depicted to indicate the cross-coupled connection between the two stages.

According to some embodiments, biasing stage 202 may be configured to limit current flow through biasing stage 202. The current may be limited for example to $I_{bias}$. Biasing stage 202 may further be configured to limit current flow through at least a segment of cross coupled stage 206 and to mitigate snapback and/or prevent breakdown across cross-coupling stage 206.

According to some embodiments, biasing stage 202 may be connected to cross-coupled stage 206 so that the current through cross-coupled stage 206 is also limited to $I_{bias}$. Biasing stage 202 may include: (a) a branch of a current mirror and/or (b) a substantially constant current source or otherwise to limit and/or determine $I_{bias}$. $I_{bias}$ may be substantially constant; however fluctuations or non-substantial changes in current may occur. Furthermore, $I_{bias}$ may be constant but may also be selectively turned off/shut down so that in non-transitory or steady states unneeded current does not flow through biasing stage 202.

According to some embodiments, biasing stage 202 is connected to cross-coupled stage 206 so that the current is also substantially limited in cross-coupled stage 206. Current in at least one branch of cross-coupled stage 206 may be limited to $I_{bias}$ or to a current that is a function of $I_{bias}$ or otherwise. Optionally, current may be limited in at least a branch of input stage 204. Current limitation may be obtained, for example, by connecting input stage 204 to cross coupled stage 206 or biasing stage 202.

According to some embodiments, biasing stage 202 may aid in preventing breakdown and/or snapback across/within cross-coupled stage 206 by limiting current $I_{bias}$. Furthermore, limitation of the current at least through cross coupled stage 206 may aid in the contention that may occur during switching of input V. When $V_{in}$ switches cross-coupled stage 206 may pull down the output and input stage 204 may pull up the output until one of the stages "wins" the contention and $V_{out}$ is stabilized. In a current-limited configuration the contention may be "won" much faster and while prior art solutions would require careful sizing of transistors within the stages this is avoided with a current-limited configuration as described. Furthermore, the configurations described may be considered more robust as they are less affected/more resilient to design corners (for example under different temperature, different process variations and more).

According to some embodiments, limiting current in at least a branch of input stage 204 and a branch of cross-coupled stage 206 may limit the crowbar current (flowing from Supply3 voltage source to ground or Supply1 voltage source which may occur when level shifter 200 flips/is in transition, a total current spike of level shifter 200 is accordingly known and controlled by the value to which Ibias is designed and may be independent of design corners and/or Supply3 level or stability.

According to some embodiments, while protection transistors above cross-coupled stage 206 may not be necessitated to avoid breakdown, they may be added.

Figure 3A:
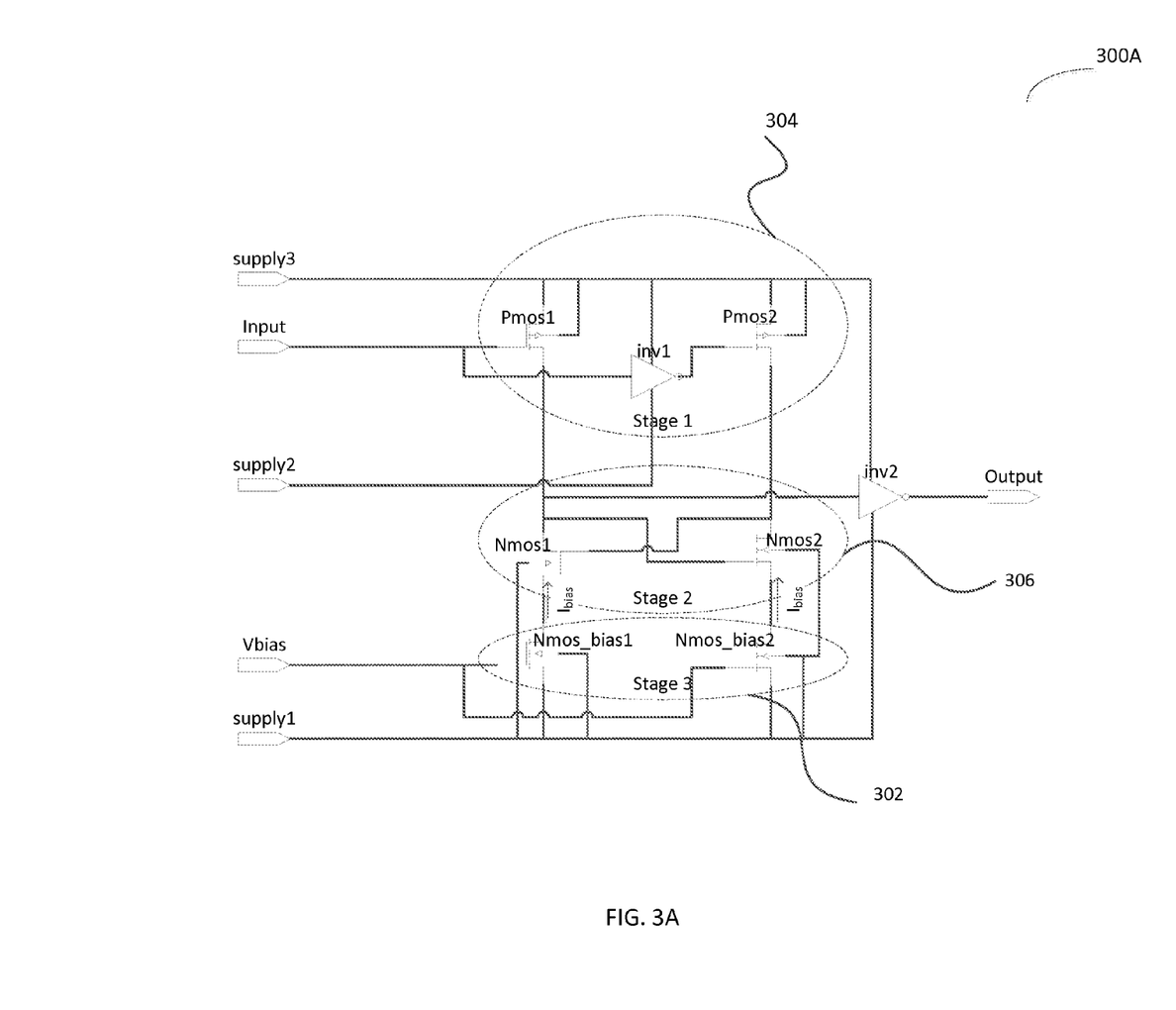
FIGS. 3A, 3C and 3D depict example circuit-level level shifters in accordance with some embodiments of the present invention.

Turning to FIG. 3A, depicted is an example circuit-level embodiment of a level shifter such as level shifter 300A. Although level shifter 200 and level shifter 300A may have common characteristics, inputs, outputs and/or elements the description of level shifter 300A is not intended to limit level shifter 200 as it is an example embodiment. Many additional configurations are understood to be within the scope of this application. Level shifter 300A. may receive some or all of the voltage supply levels, level shifter input $V_{in}$ and may output $V_{out}$ all as described with regard to level shifter 200 of FIG. 2

According to some embodiments, level shifter 300A may include at least three stages. A first stage which may be an input stage such as stage1 304, a second stage such as stage2 306 which may be a cross coupled stage and/or an output stage and a third stage stage3 302 which may be a biasing.

According to some embodiments, stage1 304 may include at least 2 Pmos transistors such as Pmos1 and Pmos2 and an inverter such as inv1. During a transitory state stage1 304 may selectively pull up $V_{out}$ toward Supply3 either through pmos1 or pmos2, depending on the logical value of $V_{in}$.

According to some embodiments, stage 2 306 may include at least 2 Nmos transistors such as Nmos1 and Nmos2 which may be HV devices, connected to Pmos1 and Pmos 2 in a cross coupled configuration as depicted. During a transitory state stage2 306 may selectively pull down an output voltage toward a lower voltage source such as level 1 through Nmos1 and/or Nmos2 depending on $V_{in}$.

According to some embodiments, stage3 302 may be configured to limit current flow through stage3 302. The current may be limited for example to $I_{bias}$. Accordingly the current through Nmos1 and Nmos2 may also be limited to Ibias which may mitigate snapback and/or prevent breakdown across Nmos1 and Nmos2 transistors of stage2 306.

According to some embodiments, Ibias level/value may be independent of the supply levels (supply1, supply2 and/or supply3) so that a single level shifter design (including sizing of Pmos1, Pmos2, Nmos1, Nmos2 and nmos_Bias1 and Nmos_bias2, for example) may be operable for a very large range of HV levels. Example levels of Supply1, Supply2 and Supply3 were discussed with regard to FIG. 2, that discussion is applicable here.

According to some embodiments, stage3 302 may include at least 2 transistors each of which may be a branch of a current mirror such as Nmos_bias1 and Nmos_bias2. According to some embodiments, LS 300A may also receive a bias input such as $V_{bias}$ which may be configured limit current through at least one branch of stage3 302. Nmos_bias1 and Nmos_bias2 may be very small and have a minor effect on the total area of the level shifter. Since adding the current limiting transistors enables control of contention without having to enlarge the HV Pmos transistors (Pmos1 and Pmos2), overall area is substantially reduced compared to at least some prior art solutions.

According to some embodiments $V_{bias}$ may be equal to supply1+Vt and/or may be a dynamic voltage source in that it substantially follows/moves with Supply1. Vt may be substantially equal or greater than the threshold voltage level of Nmos–bias1 or may try to emulate the threshold value of an average Nmos transistor. Vbias may be generated by/received from a current mirror and connected within stage3 302 to stages/branches configured to be branches of the current mirror so that current within the stages/branches is limited according to the current mirror limited current.

According to some embodiments, $I_{bias}$ may be constant but may also be selectively turned off/shut down so that, for example, when level shifter 300A is in a standby mode and/or level shifter 300A is not being used, unneeded current does not flow through stage 3 302 The current through pmos1 and pmos2 may also be limited to $I_{bias}$.

According to some embodiments, in a steady state $V_{in}$ may be constant and $I_{bias}$ may be equal to 0A, (for example, if either Pmos1 or Pmos2 or Nmos1 or Nmos2 are at an off/closed state. In this example, $I_{bias}$ may be active only during transition which may aid in saving overall circuit power for an associated IC. In another example, Vbias may be equal to Supply1 to force $I_{bias}$ to zero to avoid unneeded power consumption if Vin is unknown.

According to some embodiments, $V_{bias}$ may be forced/equal to a high voltage causing level shifter 300 to function as a versatile level shifter operable in both a non-current limited level shifter mode and a current limited mode (where $V_{bias}$ may be limited to Supply1+1V for example).

According to some embodiments, stage3 302 may aid in preventing breakdown and/or snapback across Nmos1 and Nmos2 by limiting current through them to $I_{bias}$. Furthermore, limiting of the current through Nmos1, Nmos2, Pmos1 and/or Pmos2 may improve switching functionality. When switching $V_{in}$, Nmos1 and/or Nmos2 may pull down the output and Pmos1 and/or Pmos2 may pull up the output causing contention until one of the stages (stage1 or stage2) "wins" the contention and $V_{out}$ is substantially stabilized. Contrary to many prior art configurations, since the Nmos transistors (such as Nmos1, Nmos2, Nmos_bias1 and Nmos_bias2) may be small since the current limiting protect against breakdown and large protection transistors are not needed the Pmos transistors (Pmos1 and Pmos2) do not need to be enlarged to overcome contention between stage1 304 and stage2 306. A size of a transistor may be defined as the width (w) of the transistor divided by the length (l) of the transistor. Accordingly a typical ratio between the Pmos size and Nmos size may be 5:1 or less (some example may include 4:1 and 2:1).

According to some embodiments, limiting current in at least a branch of stage1 304 (Pmos1 is an example branch of stage 1) and a branch of stage2 306 (Nmos1 is an example branch of Stage2 306) may limit the crowbar current which may occur when level shifter 300A flips/is in transition/switches.

Figure 3B:
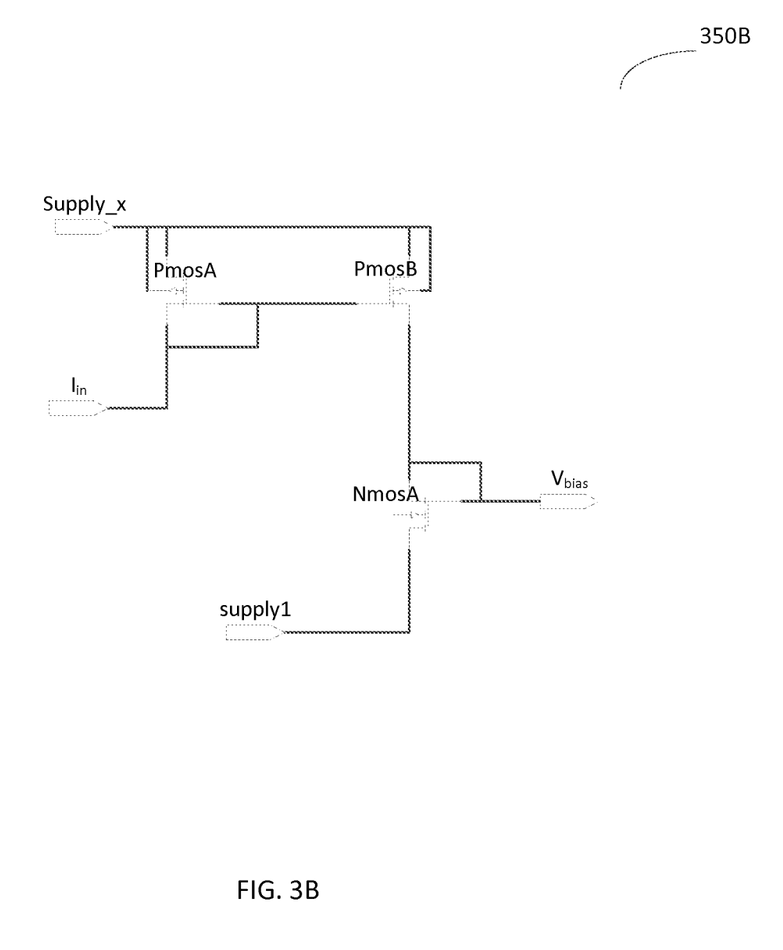
FIG. 3B depicts an example circuit-level bias voltage producing/supply circuit in accordance with some embodiments of the present invention.

Turning to FIG. 3B, depicted is an example circuit-level bias voltage producing/supply circuit such as circuit 350B in accordance with some embodiments. Circuit 350B may receive a supply from a supply source such as Supply_X. Supply_X may be equal to Supply3 of FIG. 3A or may be equal to Vdd or independent/non-dependent on level shifter 300 supply voltages or otherwise and Supply1 which may be substantially equal to Supply1 of FIG. 3A. Circuit 350 may also receive a current source such as $I_{in}$. Circuit 350b may include at least two Pmos transistors such as PmosA and PmosB, and at least one Nmos transistor such as NmosA. Circuit 350B may produce a voltage supply such as $V_{bias}$, which may be provided to the $V_{bias}$ input of FIG. 3A. Control of Ibias current value may be achieved by determining $I_{in}$ and sizing/rationing between NmosA (in FIG. 3B) and Nmos_Bias1 and Nmos_Bias2 (which may be equal to each other and shown in FIG. 3A). Circuit 350B may be an example of at least one branch of a current mirror. Many additional configurations are understood and FIG. 3B is meant to be a non-limiting example. In another example, $I_{in}$ may be directly connected to NmosA from above in which PmosA and PmosB may not be needed).

Figure 3C:
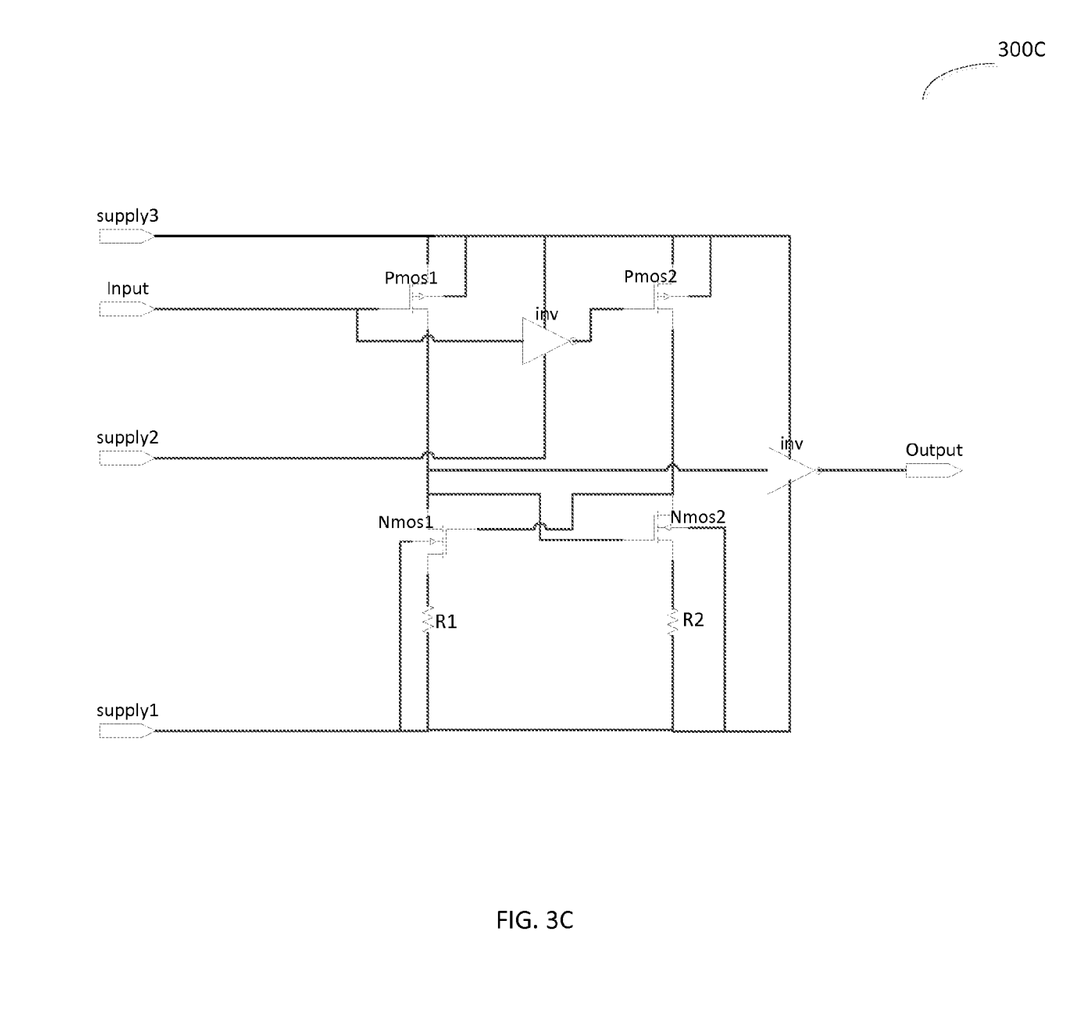

Turning to FIG. 3C, depicted is an example circuit-level embodiment of a level shifter such as level shifter 300C. It is understood that level shifter 300C is substantially similar to level shifter 300A. According to some embodiments, the biasing stage includes resistors R1 and R2 which may be configured to limit current flow through at least a section of level shifter 300C. The current may be limited for example to $I_{bias}$. Accordingly the current through Nmos1 and Nmos2 may also be limited to Ibias which may mitigate snapback and/or prevent breakdown across Nmos1 and Nmos2 transistors.

Figure 3D:
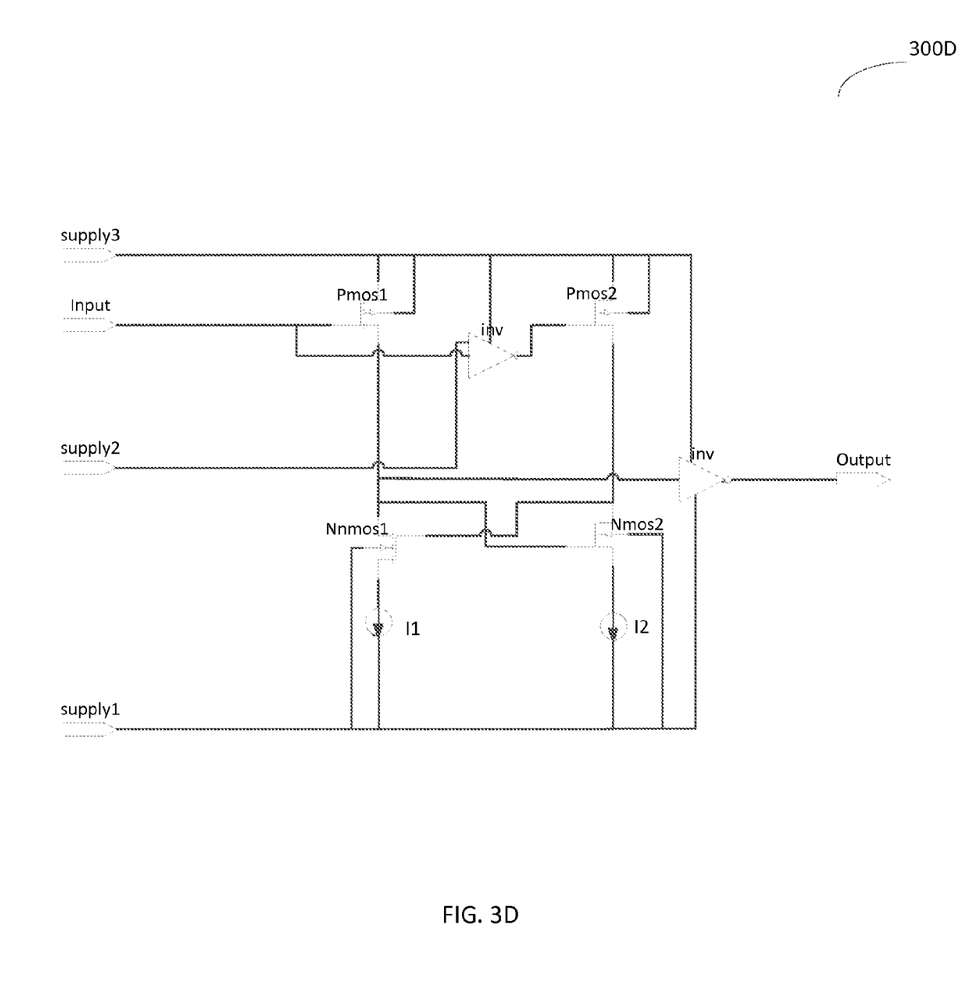

Turning to FIG. 3D, depicted is an example circuit-level embodiment of a level shifter such as level shifter 300D. It is understood that level shifter 300D is substantially similar to level shifter 300A. According to some embodiments, the biasing stage may include substantially constant/digital current sources 11 and 12 which may be configured to limit current flow through at least a section of level shifter 300D. The current may be limited for example to $I_{bias}$. Accordingly the current through Nmos1 and Nmos2 may also be limited to Ibias which may mitigate snapback and/or prevent breakdown across Nmos1 and Nmos2 transistors.

Figure 4:
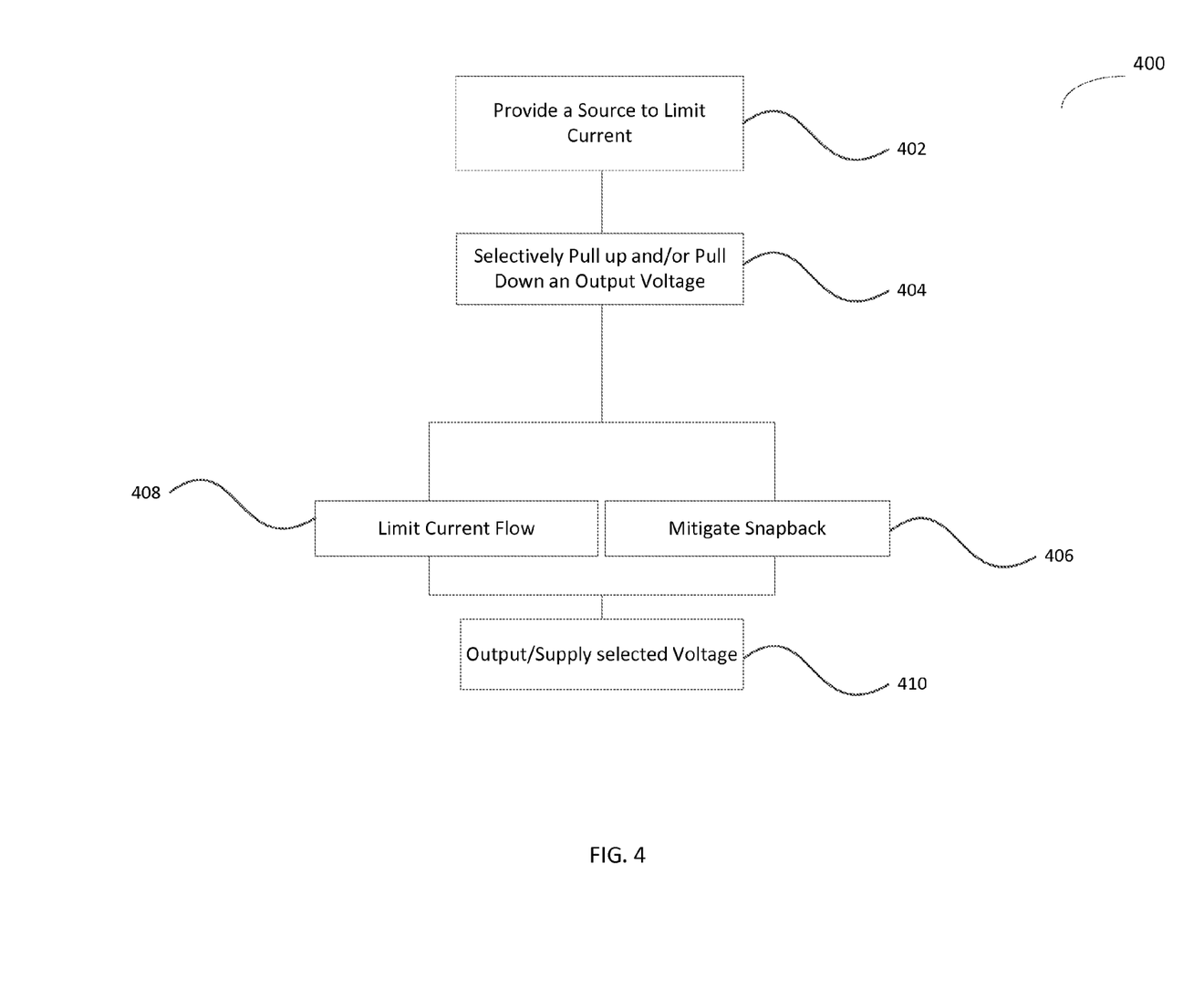
FIG. 4 is a flow chart of an example method for selectively supplying voltage through a Level Shifter in accordance with some embodiments of the present invention.

Turning to FIG. 4, shown is a flow chart 400 of an example method for selectively supplying voltage through a multi-stage Level Shifter in accordance with some embodiments of the present invention. A source to limit current through the level shifter may be provided (step 402). Such a source may be a biasing source or a fixed current or otherwise. In response to an input changing/switching, an output voltage may be pulled down and/or pulled up either toward a high or low voltage (step 404). It is understood that contention between one or more stages may occur for at least part of the transition where both pulling-up and pulling-down may occur simultaneously. The current limited circuit may cause both the intended limitation of current flow through at least a first segment of the level shifter (step 408) and mitigation of snapback and/or breakdown of Nmos type transistors in the first segment (step 406). When a steady state is reached/achieved, wherein an output voltage reaches a requested/selected voltage (based on Vin) the level shifter may maintain a substantially stable output while the input remains constant; if the input switches again the process is repeated (and pull-up pull down of step 404 is determined by the new/updated input). Furthermore, $V_{out}$ may also follow the supply voltages while $V_{in}$ is stable.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. An integrated circuit voltage level shifter comprising:
    a first set of pull-up transistors adapted to selectively pull an output voltage towards a high voltage source level based on an input;
    a second set of pull-down transistors adapted to selectively pull the output voltage towards a lower voltage source level based on said input; and
    a third set of transistors to limit current flow through said second set of pull-down transistors and to mitigate snapback of said second set of pull-down transistors using a bias gate voltage wherein said input is substantially limited between said high voltage source level and a medium voltage and said output voltage is substantially limited between said high voltage source level and said lower voltage source level and further wherein said high voltage source level is selected from the range of: 0V to 10V and said medium voltage source is 0V and said lower voltage source is selected from the range of minus 10V and 0V, wherein said high voltage source level is higher or equal to said medium voltage source and said medium voltage source is higher or equal to said lower voltage source level excluding when all of said voltage sources are 0V.

2. The integrated circuit of claim 1, further comprising a bias gate voltage source to provide said bias gate voltage so that a predetermined current flows through said third set of transistors and wherein said bias gate voltage is dependent on said lower voltage source level.

3. The integrated circuit of claim 2, wherein said bias gate voltage source is at least one branch of a current mirror.

4. The integrated circuit of claim 1, wherein current flowing through said first set of pull-up transistors is limited by said third set of transistors.

5. The integrated circuit of claim 1, wherein said first set of pull-up transistors are pmos transistors, said second set of pull down transistors are nmos transistors and said third set of transistors are nmos transistors.

6. The integrated circuit of claim 1, wherein the ratio between the size of at least one transistor included in said first set of transistors and the size of at least one transistor included in said second set of transistors is no greater than 6.

7. The integrated circuit of claim 6, wherein said ratio is no greater than 3.

8. An integrated circuit comprising:
an NVM memory array;
ancillary circuitry including a controller to control said NVM memory array; and
at least one voltage level shifter to selectively supply said NVM memory array and said ancillary circuitry with either a high voltage source or a lower voltage source, said at least one level shifter including a first stage to selectively pull an output voltage towards the high voltage source based on an input;
a second stage to selectively pull the output voltage towards the lower voltage source based on said input; and
a third stage to limit current flow through said second stage and to mitigate snapback across said second stage; wherein said input is substantially limited between said high voltage source and a medium voltage and said output voltage is substantially limited between said high voltage source and said lower voltage source and further wherein said high voltage source is selected from the range of: 0V to 10V and said medium voltage source is 0V and said lower voltage source is selected from the range of minus 10V and 0V, wherein said high voltage source is higher or equal to said medium voltage source and said medium voltage source is higher or equal to said lower voltage source excluding when all of said voltage sources are 0V.

9. The integrated circuit of claim 8, further comprising a biasing voltage source to cause a predetermined current through said first stage.

10. The integrated circuit of claim 9, wherein said biasing voltage includes at least one branch of a current mirror.

11. The integrated circuit of claim 8, wherein current flowing through said second stage is limited by said third stage.

12. The integrated circuit of claim 8, wherein said first stage includes a first set of pull-up transistors, said second stage includes a second set of pull down transistors, and said third stage includes a third set of transistors.

13. The integrated circuit of claim 12, wherein said first set of pull-up transistors are pmos transistors, said second set of pull down transistors are nmos transistors and said third set of transistors are nmos transistors.

14. The integrated circuit according to claim 12, wherein said third set of transistors are a branch of a current mirror.

15. The integrated circuit of claim 12, wherein the ratio between the size of said first set of pull up transistors and the size of said second set of pull down transistors is no larger than 5.

16. The integrated circuit of claim 15, wherein said ratio is no larger than 4.

17. The integrated circuit of claim 8, wherein said input is substantially limited between said high voltage source and a medium voltage and said third stage receives a bias gate voltage, wherein said bias gate voltage is dependent on said lower voltage source.

18. A method of level shifting associated with an integrated circuit, comprising:
selectively pulling an output voltage up toward a high voltage source using a first set of transistors or using a second set of transistors, pulling down toward a lower voltage source based on an input;
providing a bias gate voltage to cause a fixed current through at least a segment of the integrated circuit; and
using the fixed current source for both (a) limiting current flow through said second set of transistors and (b) mitigating snapback on said second set of transistors wherein said input is substantially limited between said high voltage source and a medium voltage and said output voltage is substantially limited between said high voltage source and said lower voltage source and further wherein said high voltage source is selected from the range of: 0V to 10V and said medium voltage source is 0V and said lower voltage source is selected from the range of minus 10V and 0V, wherein said high voltage source is higher or equal to said medium voltage source and said medium voltage source is higher or equal to said lower voltage source excluding when all of said voltage sources are 0V.

* * * * *